US008738999B2

(12) United States Patent
Sawada

(10) Patent No.: US 8,738,999 B2
(45) Date of Patent: May 27, 2014

(54) INFORMATION PROCESSING APPARATUS, COMMUNICATION CONTROL METHOD, AND COMMUNICATION CONTROL SYSTEM

(75) Inventor: Keito Sawada, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 175 days.

(21) Appl. No.: 13/353,568

(22) Filed: Jan. 19, 2012

(65) Prior Publication Data

US 2012/0192045 A1 Jul. 26, 2012

(30) Foreign Application Priority Data

Jan. 21, 2011 (JP) ................................. 2011-011400

(51) Int. Cl.
*H03M 13/00* (2006.01)

(52) U.S. Cl.
USPC ............................ 714/776; 714/748; 714/816

(58) Field of Classification Search
USPC ......... 714/807, 748, 776, 752, 758, 774, 799; 370/389, 469, 466, 471
See application file for complete search history.

(56) References Cited

U.S. PATENT DOCUMENTS

| 5,440,545 | A | * | 8/1995 | Buchholz et al. | ............. 370/426 |
| 7,553,840 | B2 | * | 6/2009 | Devasagayaraj et al. | ..... 514/269 |
| 7,864,798 | B2 | * | 1/2011 | Chandra et al. | ................ 370/466 |
| 7,903,687 | B2 | * | 3/2011 | Basso et al. | ................... 370/471 |
| 2008/0095189 | A1 | * | 4/2008 | Frazier et al. | ................. 370/469 |
| 2011/0194555 | A1 | * | 8/2011 | Shen et al. | .................... 370/389 |

FOREIGN PATENT DOCUMENTS

| JP | 2007-215013 | 8/2007 |
| JP | 2009-119849 | 6/2009 |

* cited by examiner

*Primary Examiner* — Fritz Alphonse
(74) *Attorney, Agent, or Firm* — Cooper & Dunham LLP

(57) ABSTRACT

According to an embodiment, an information processing apparatus includes: a receiving unit that receives a fragment packet; an extracting unit that extracts checksum information of which packet has not been subjected to the fragmentation process, and causes the checksum information to be stored in a checksum storage unit; a calculating unit that performs a checksum calculation on each of the plurality of received fragment packets, integrates a calculation result of each fragment packet, and causes an integrated calculation result to be stored in a calculation result storage unit; and a determining unit that determines whether or not there is an error in a packet obtained as a result of combining based on the integrated calculation result stored and the checksum information stored.

13 Claims, 4 Drawing Sheets

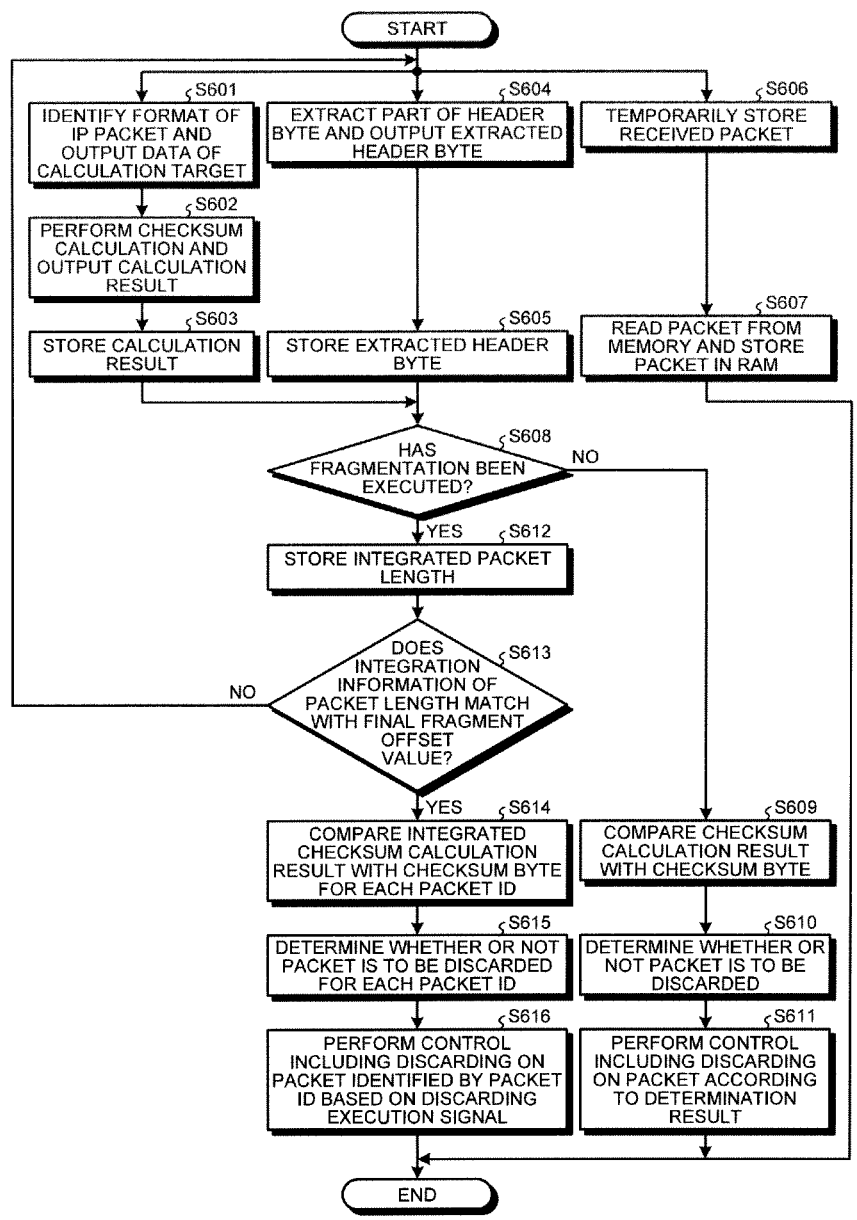

INFORMATION PROCESSING APPARATUS, COMMUNICATION CONTROL METHOD, AND COMMUNICATION CONTROL SYSTEM

CROSS-REFERENCE TO RELATED APPLICATIONS

The present application claims priority to and incorporates by reference the entire contents of Japanese Patent Application No. 2011-011400 filed in Japan on Jan. 21, 2011.

BACKGROUND OF THE INVENTION

1. Field of the Invention

The present invention relates to an information processing apparatus, a communication control method, and a communication control system.

2. Description of the Related Art

Conventionally, when network data is transmitted and received, an error correction code (ECC) is added to the data so as to detect the occurrence of a data error. As representative protocols, Transmission Control Protocol (TCP) and User Datagram Protocol (UDP) have been standardized in the Internet Engineering Task Force (IETF) as RFC793 and RFC768, respectively. Packet formats of the protocols include a checksum field, and an error is detected so that a receiver side checks a checksum allocated by a transceiver side.

A data checking process based on a checksum calculation can be performed by software, but a different technique has been suggested which performs the data checking process based on the checksum calculation by hardware so that the load to a central processing unit (CPU) may be reduced.

There is a process of fragmenting one TCP/UDP packet into a plurality of Internet Protocol (IP) packets and transferring the IP packets. This process is called fragmentation (a fragmentation process) of the TCP/UDP packet.

In a conventional checksum function by hardware on a fragmented packet, the calculation was performed after all packets of a calculation target were temporarily stored in a random access memory (RAM). Since a plurality of fragment packets of the TCP/UDP packet were transferred in random order it was necessary to mount many RAMs.

In this regard, techniques have been suggested that perform a calculation by software only when a TCP/UDP packet is fragmented. For example, in a technique disclosed in Japanese Patent Application Laid-open No. 2007-215013, a checksum is checked not only when fragmentation is not executed but also when fragmentation is executed, but software control is required when fragmentation is executed.

However, when software control is performed for the execution of fragmentation, a problem occurs in that the calculation processing time increases.

SUMMARY OF THE INVENTION

According to an embodiment, there is provided an information processing apparatus that includes: a receiving unit that receives a fragment packet representing a packet that has been subjected to a fragmentation process; an extracting unit that extracts checksum information of which packet has not been subjected to the fragmentation process from any one of a plurality of received fragment packets, and causes the checksum information to be stored in a checksum storage unit; a calculating unit that performs a checksum calculation on each of the plurality of received fragment packets, integrates a calculation result of each fragment packet, and causes an integrated calculation result to be stored in a calculation result storage unit; and a determining unit that determines whether or not there is an error in a packet obtained as a result of combining the plurality of fragment packets, based on the integrated calculation result stored in the calculation result storage unit and the checksum information stored in the checksum storage unit.

According to another embodiment, there is provided a communication control method, operated in an information processing apparatus, that includes: receiving a fragment packet representing a packet that has been subjected to a fragmentation process by a receiving unit; extracting checksum information of which packet has not been subjected to the fragmentation process from any one of a plurality of received fragment packets, and causing the checksum information to be stored in a checksum storage unit by an extracting unit; calculating a checksum on each of the plurality of received fragment packets, integrating a calculation result of each fragment packet, and causing an integrated calculation result to be stored in a calculation result storage unit by a calculating unit; and determining whether or not there is an error in a packet obtained as a result of combining the plurality of fragment packets, based on the integrated calculation result stored in the calculation result storage unit and the checksum information stored in the checksum storage unit by a determining unit.

According to still another embodiment, there is provided a communication control system configured with a plurality of information processing apparatuses connectable to a network. The communication control system includes: a first information processing apparatus including a transmitting unit that transmits a fragment packet representing a packet that has been subjected to a fragmentation process; and a second information processing apparatus including: a receiving unit that receives the fragment packet representing the packet that has been subjected to the fragmentation process; an extracting unit that extracts checksum information of which packed has not been subjected to the fragmentation process from any one of a plurality of received fragment packets, and causes the checksum information to be stored in a checksum storage unit; a calculating unit that performs a checksum calculation on each of the plurality of received fragment packets, integrates a calculation result of each fragment packet, and causes an integrated calculation result to be stored in a calculation result storage unit; and a determining unit that determines whether or not there is an error in a packet obtained as a result of combining the plurality of fragment packets, based on the integrated calculation result stored in the calculation result storage unit and the checksum information stored in the checksum storage unit.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 6 is a flowchart illustrating a procedure of a process performed by an information processing apparatus according to the present embodiment when a packet is received.

DETAILED DESCRIPTION OF THE PREFERRED EMBODIMENTS

Exemplary embodiments of an information processing apparatus, a communication control method, and a communication control system will be described in detail with reference to the accompanying drawings.

Figure 1:
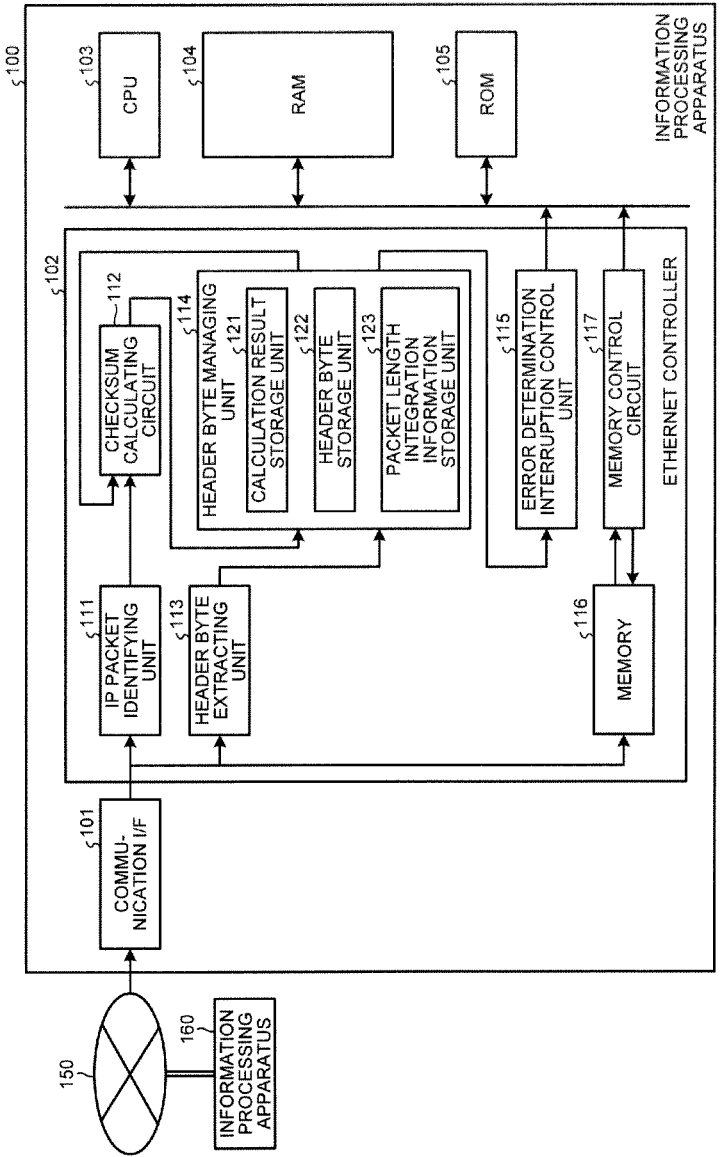
FIG. 1 is a block diagram illustrating a configuration of an information processing apparatus according to an embodiment.

FIG. 1 is a block diagram illustrating a configuration of an information processing apparatus according to an embodiment. As illustrated in FIG. 1, a communication control system is implemented by connecting information processing apparatuses 100 and 160 through a network 150.

The information processing apparatus 160 has the same configuration as the information processing apparatus 100. In the present embodiment, the information processing apparatus 160 transmits fragmented packets, which have been subjected to the fragmentation (the fragmentation process), to the information processing apparatus 100.

The information processing apparatus 100 includes a communication interface (I/F) 101, an Ethernet (registered trademark) controller 102, a CPU 103, a RAM 104, and a read only memory (ROM) 105. The present embodiment will be described in connection with an example in which the information processing apparatus 100 receives packets from the information processing apparatus 160.

The communication interface 101 functions as an interface that controls transmission/reception of packets to/from the network 150. An interface, which is connectable to an Ethernet (registered trademark) that supports 10/100/100BASE-T/TX and full-duplex/half-duplex, is used as the communication interface 101. The communication interface 101 receives fragmented packets which have been fragmented (that is, which have been subjected to the fragmentation process) by the information processing apparatus 160.

Figure 2:
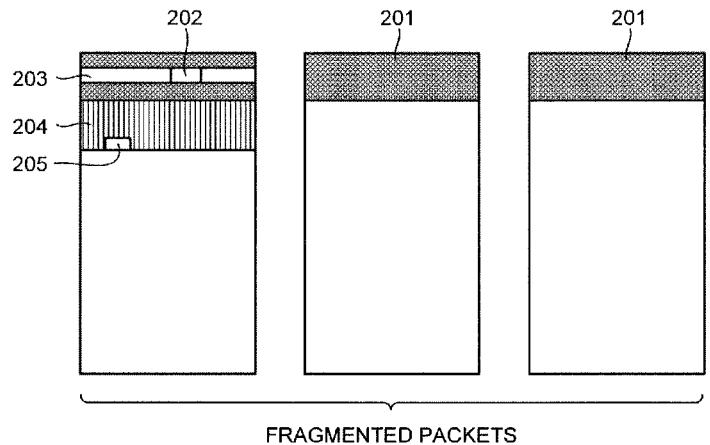
FIG. 2 is a diagram illustrating an example of a structure of a fragmented packet received by a communication interface according to the present embodiment.

In the present embodiment, the communication interface 101 receives packets, each having an IP header, obtained by performing the fragmentation process on the TCP/UDP packet. FIG. 2 is a diagram illustrating an example of a structure of the fragmented packets received by the communication interface 101 according to the present embodiment. As illustrated in FIG. 2, an IP header 201 is added to each of the packets obtained by fragmenting the TCP/UDP packet. The IP header 201 includes an Flg byte 202 and an ID byte 203. As illustrated in FIG. 2, as for one TCP/UDP packet transferred in the form of a plurality of IP packets, only one IP packet contains a TCP/UDP header 204 of the TCP/UDP packet. The remaining IP packets store only data. The TCP/UDP header 204 includes a checksum byte 205 for checking the TCP/UDP packet.

Figure 3:
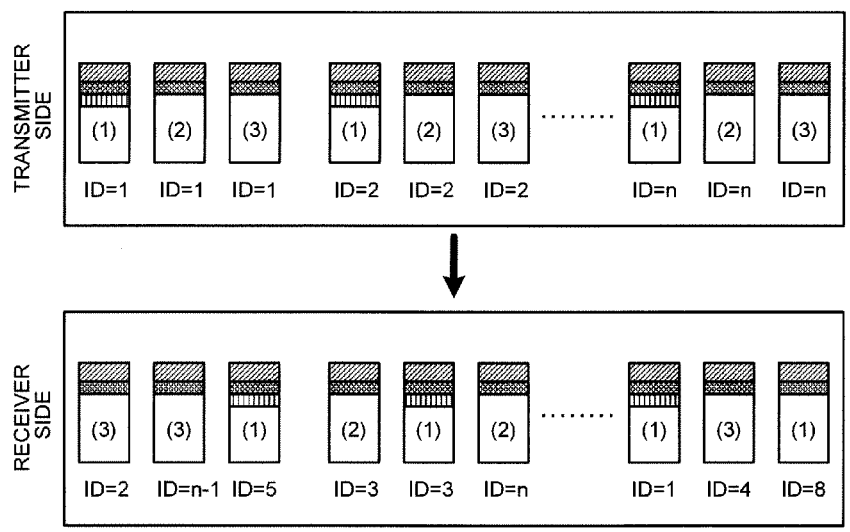
FIG. 3 is a diagram illustrating an example in which order that an information processing apparatus at a transmitter side transmits packets is different from order that an information processing apparatus at a receiver side receives packets.

When fragmentation has been performed, an information processing apparatus at a receiver side does not necessarily receive the TCP/UPD packets transmitted by an information processing apparatus at a transmitter side in the order of transmission. That is, it is not necessary that the information processing apparatus at a receiver side starts to receive a TCP/UPD packet after completely receiving a preceding TCP/UDP packet. FIG. 3 is a diagram illustrating an example in which the order that the information processing apparatus at a transmitter side transmits packets is different from the order that the information processing apparatus at a receiver side receives packets. As illustrated in FIG. 3, even though fragmented IP packets are transmitted in the order of ID of the TCP/UDP packet, the receiver side does not necessarily receive the IP packets in order of ID. That is, a plurality of IP packets fragmented from the TCP/UDP packets are transferred in random order. A conventional configuration for processing the IP packets will be described below. As the conventional technique, there is a technique of performing a data checking process based on a checksum calculation by separately provided hardware so as to reduce the load to the CPU.

Figure 4:
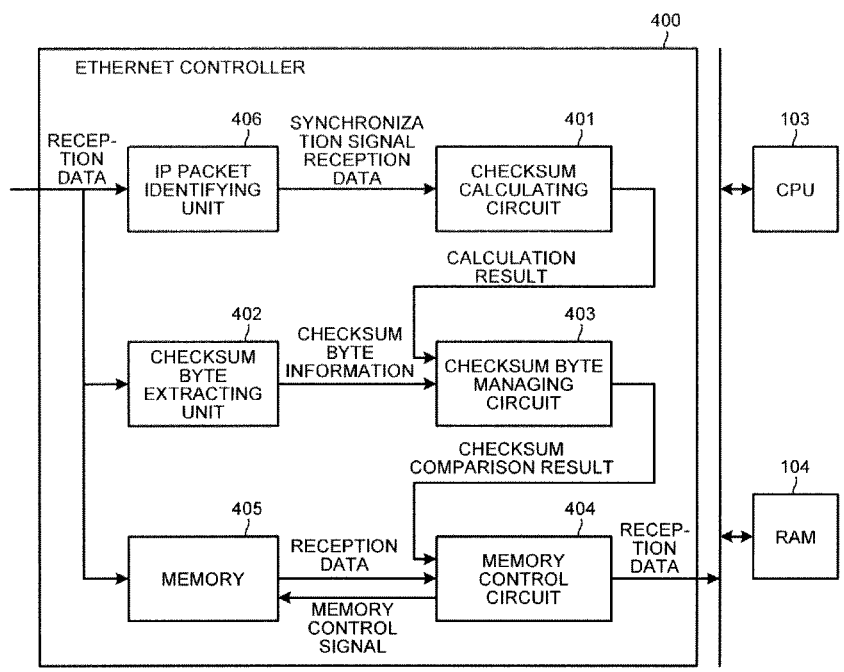
FIG. 4 is a diagram illustrating a block configuration of a conventional Ethernet (registered trademark) controller that performs a checksum calculation by hardware.

FIG. 4 is a block diagram illustrating the configuration of a conventional Ethernet controller that performs a checksum calculation by hardware. As illustrated in FIG. 4, an Ethernet controller 400 includes an IP packet identifying unit 406, a checksum calculating circuit 401, a checksum byte extracting unit 402, a checksum byte managing circuit 403, a memory 405, and a memory control circuit 404. An information processing apparatus including the Ethernet controller 400 illustrated in FIG. 4 includes the same components as a typical personal computer (PC) such as the CPU 103, the RAM 104, and the like.

The IP packet identifying unit 406 receives the Ethernet frames from a transmission path side. The IP packet identifying unit 406 recognizes a frame format by a synchronization pattern, a frame head position signal, or the like, and outputs data of a calculation target to the checksum calculating circuit 401 in synchronization with a data synchronization signal (for example, a signal that makes a calculation target part active).

The checksum calculating circuit 401 receives the packet data and the synchronization signal from the IP packet identifying unit 406, and performs the checksum calculation on the packet data. A calculation range is determined by the received synchronization signal.

The checksum byte extracting unit 402 receives the Ethernet frames from the transmission path side. The checksum byte extracting unit 402 extracts a checksum byte included the TCP/UDP header by the synchronization pattern, the frame head position signal, or the like, and outputs the extracted checksum byte to the checksum byte managing circuit 403.

The checksum byte managing circuit 403 receives the checksum byte from the checksum byte extracting unit 402, and receives a checksum calculation result from the checksum calculating circuit 401. The checksum byte managing circuit 403 compares the checksum byte with the checksum calculation result, and determines whether the received packet is a normal packet or an error packet. The checksum byte managing circuit 403 outputs a determination result to the memory control circuit 404 as a checksum comparison result.

The memory control circuit 404 receives the checksum comparison result from the checksum byte managing circuit 403. The memory control circuit 404 controls packets accumulated in the memory 405 according to the checksum comparison result. For example, when it is determined that the received packet is the normal packet, the memory control circuit 404 reads the corresponding packet, and outputs the read packet to the RAM 104. However, when it is determined that the received packet is the error packet, the memory control circuit 404 discards the corresponding packet. This control is implemented by controlling a read pointer of the memory 405.

The memory 405 temporarily stores reception data (received packets) until control by the memory control circuit 404 is performed. Generally, a necessary capacity of the memory 405 can be decided in view of the performance or the like, however, when the checksum calculation process and the discarding process are performed at the Ethernet controller 400 side, the memory 405 needs enough capacity to accumulate the packets received until the determination result by the checksum is derived. Particularly, when the checksum calculation process and the discarding process are performed on the fragmented packets, enough memory capacity to accumulate packets corresponding to a plurality of IDs is needed.

As described above, when the process is performed by the conventional Ethernet controller 400, it is necessary to save all data fragmented from a plurality of TCP/DUP packets received in a random order in the memory 405 if the fragmentation is considered. For this reason, a problem occurs in that the memory 405 needs a large capacity. Next, a conventional technique of performing the process by software will be described.

Figure 5:
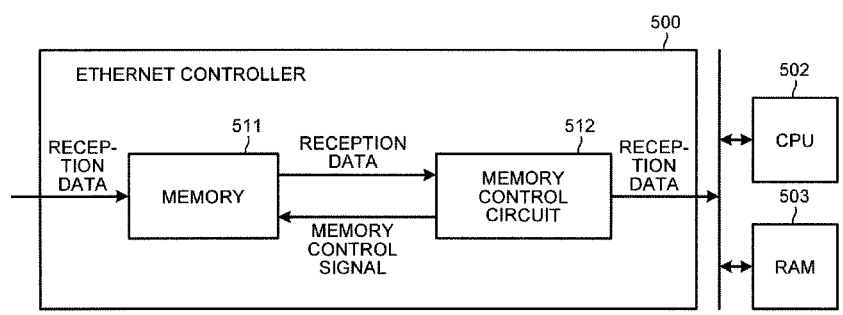
FIG. 5 is a diagram illustrating a block configuration of a conventional Ethernet controller that performs a checksum calculation by software.

FIG. 5 is a diagram illustrating a block configuration of a conventional Ethernet controller that performs a checksum calculation by software. As illustrated in FIG. 5, an Ethernet controller 500 includes a memory 511 and a memory control circuit 512.

The memory 511 stores the reception data. The capacity of the memory 511 is decided in view of the performance or the like.

The memory control circuit 512 controls the memory 511, reads the reception data, and outputs the read data to a RAM 503.

Software operating on a CPU 502 processes the reception data stored in the RAM 503. In the example illustrated in FIG. 5, software operating on the CPU 502 also performs the checksum calculation of the packet, and determines whether or not the received packet is an error packet.

The RAM 503 stores the data which is to be processed by the software. The data stored in the RAM 503 is read out by software on the CPU 502, and a calculation process is executed. Further, when the checksum calculation at the time of fragmentation and the discarding process are performed, enough capacity to store packets corresponding to a plurality of IDs is necessary.

That is, when the process is performed by software operating on the CPU 502 other than hardware at the Ethernet controller 500 side, the storage capacity of the memory 511 at the Ethernet controller 500 side does not need to be increased to be larger than the conventional art, however, the RAM 503 side needs enough capacity to save the fragmented data of a plurality of TCP/DUP packets transmitted in a random order.

As described above, when the process is performed by software, a problem occurs in that the processing time increases by memory access, the calculation process by the CPU 502, and the like, compared to when the process is performed by hardware provided at the Ethernet controller side. In this regard, employed is generally a technique of performing a calculation by software only when the TCP packet is fragmented. However, similarly even in this case, enough storage capacity for saving the TCP packets is necessary. In addition, a problem occurs in that the calculation processing time increases due to the software process. Thus, in the present embodiment, the following configuration is employed.

Referring back to FIG. 1, the ROM 105 stores a program which operates on a CPU 103 and the like.

The CPU 103 controls the overall information processing apparatus 100. The CPU 103 reads the program (software) stored in the ROM 105, and performs the controls by software. The software operating on the CPU 103 performs various controls on data stored in the RAM 104.

The RAM 104 stores the data which is to be processed by the software.

The Ethernet controller 102 includes an IP packet identifying unit 111, a checksum calculating circuit 112, a header byte extracting unit 113, a header byte managing unit 114, an error determination interruption control unit 115, a memory 116, and a memory control circuit 117.

The IP packet identifying unit 111 receives the Ethernet frames from the communication interface 101. The IP packet identifying unit 111 recognizes a frame format by a synchronization pattern, a frame head position signal, or the like, and outputs data of a calculation target to the checksum calculating circuit 112 in synchronization with a data synchronization signal (for example, a signal that makes a calculation target part active).

The checksum calculating circuit 112 receives the packet data and the synchronization signal from the IP packet identifying unit 111, and performs the checksum calculation on the packet data. A calculation range is determined by the received synchronization signal.

When the TCP/UDP packet has been fragmented, the checksum calculating circuit 112 receives a calculation interim result from the header byte managing unit 114, and performs the checksum calculation using the received calculation interim result. As described above, the checksum calculating circuit 112 performs the checksum calculation on each of a plurality of fragmented packets, integrates the calculation results of the TCP/UDP packets, and outputs an integrated calculation result to the header byte managing unit 114. The header byte managing unit 114 stores the calculation result in a calculation result storage unit 121. The header byte managing unit 114 outputs the calculation interim result to the checksum calculating circuit 112 each time when the calculation interim result is requested.

The fragmented data is transferred in a random order, but a normal calculation can be performed even in the case of the random order by using a characteristic of the checksum calculation (complement sum calculation of one (1)).

The header byte extracting unit 113 receives the Ethernet frames from the communication interface 101. The header byte extracting unit 113 extracts fragment information (a fragment byte and a fragment offset byte), an ID byte, and a packet length byte by the synchronization pattern, the frame head position signal, or the like; and outputs the extracted information to the header byte managing unit 114.

When the TCP/UDP header is included in the received Ethernet frame, the header byte extracting unit 113 extracts a checksum byte of the TCP/DUP packet which is the one before fragmented; and outputs the extracted checksum byte to the header byte managing unit 114. The output checksum byte is stored in a header byte storage unit 122.

The header byte managing unit 114 includes the calculation result storage unit 121, the header byte storage unit 122, and a packet length integration information storage unit 123. The header byte managing unit 114 receives the fragment information (the fragment byte and the fragment offset byte), the ID byte, the packet length byte, and the checksum byte from the header byte extracting unit 113, and receives the calculation result or the calculation interim result from the checksum calculating circuit 112.

The calculation result storage unit 121 stores the received calculation result or the calculation interim result for each ID identifying the TCP/UDP packet.

The header byte storage unit 122 stores the header bytes, such as the fragment offset byte, the ID byte, the packet length byte, and the checksum byte, for each ID identifying the TCP/UDP packet.

The packet length integration information storage unit 123 integrates the packet lengths of the received packets among the fragmented packets, and stores an integrated packet length for each ID identifying the TCP/UDP packet.

The header byte managing unit 114 determines whether or not the fragmentation has been executed, based on the fragment byte extracted by the header byte extracting unit 113. The following process is performed depending on whether or not the fragmentation has been executed.

When the fragmentation has not been executed, the header byte managing unit 114 compares the checksum calculation result obtained by the checksum calculating circuit 112 with the checksum byte extracted by the header byte extracting unit 113, and determines whether the received packet is a normal packet or an error packet. The header byte managing unit 114 outputs a determination result to the error determination interruption control unit 115 as a checksum comparison result.

However, when the fragmentation has been executed, since the header byte managing unit 114 manages the received checksum calculation result in units of IP packets, there is a possibility that the received checksum calculation result might be a calculation interim result. In the process of performing a calculation, the header byte managing unit 114 updates the calculation result storage unit 121 using the calculation interim result, and exchanges the calculation interim result with the checksum calculating circuit 112 as necessary. At this time, the calculation interim result to be used is recognized based on the ID byte of each packet.

As described above, information stored in the calculation result storage unit 121, information stored in the header byte storage unit 122, and information stored in the packet length integration information storage unit 123 are referred based on the ID byte included in the received packet.

The packet length managed by the packet length integration information storage unit 123 is managed so that the lengths of the received packets are integrated for each ID. The header byte managing unit 114 can determine whether or not the last IP packet has been received, based on the packet length stored in the packet length integration information storage unit 123 and the fragment offset byte stored in the header byte storage unit 122. That is, when the integrated packet length is equal to the fragment offset value, it can be determined that the calculation on one TCP packet is finished. Then, when the calculation is finished, the header byte managing unit 114 outputs the ID and the checksum comparison result to the error determination interruption control unit 115.

The error determination interruption control unit 115 detects an error packet based on the ID and the checksum comparison result input from the header byte managing unit 114. That is, the error determination interruption control unit 115 determines whether or not the TCP/UDP packet identified by the received ID is the error packet using the checksum comparison result based on the calculation result integrated in the calculation result storage unit 121 and the checksum byte stored in the header byte storage unit 122. As described above, in the present embodiment, it is determined whether or not there is an error in each TCP/UDP packet identified by the ID.

The error determination interruption control unit 115 outputs a discarding execution signal representing whether or not each packet is to be discarded based on the determination result to the CPU 103.

The memory 116 temporarily stores the reception data received from the communication interface 101. The capacity of the memory 116 is determined in view of the performance. The memory 116 does not need the capacity corresponding to one TCP packet since part of the checksum calculation is performed at the Ethernet controller 102 (hardware) side but the discarding process is not performed. Similarly, the memory 116 does not need to secure the capacity capable of coping with the TCP packets corresponding to a plurality of IDs.

The memory control circuit 117 reads data from the memory 116, and transfers the read data to the RAM 104. The memory control circuit 117 does not perform the packet discarding process and thus does not need to perform an operation in which the checksum calculation result is considered.

The software operating on the CPU 103 refers to the input discarding execution signal, and performs control so that the packet identified by the ID is discarded (deleted) from the RAM 104 when the input discard execution signal represents discarding.

The RAM 104 stores the data which is to be processed by the software operating on the CPU 103. The data includes the reception data (a plurality of packets) transferred from the memory control circuit 117. The RAM 104 also stores the packet data which is being subjected to the calculation. However, at a point in time when it is determined that the packet is to be discarded, discarding is performed without securing an entire packet. Thus use capacity can be reduced.

In the Ethernet controller 102 according to the present embodiment, components such as the header byte extracting unit 113, the checksum calculating circuit 112, and the error determination interruption control unit 115, are implemented by hardware. Thus, the load of the CPU 103 can be reduced.

When the checksum of the TCP/UDP packet is checked, the Ethernet controller 102 according to the present embodiment can check the checksum of the received TCP packet by hardware even when the fragmentation has been executed.

The information processing apparatus 100 according to the present embodiment can perform the checksum calculation of the TCP/UDP packet through the above described configuration since a transmission source executes the checksum calculation on the data of the TCP packet in a transfer order, however, a receiver side may not execute the checksum calculation on the data in the transfer order.

Next, a description will be made in connection with a process performed by the information processing apparatus 100 according to the present embodiment when a packet is received. FIG. 6 is a flowchart illustrating a procedure of a process performed by the information processing apparatus 100 according to the present embodiment. In this flowchart, when a packet is received, a process of step S601, a process of step S604, and a process of step S606 start in parallel.

First, in step S601, the IP packet identifying unit 111 identifies the format of a received IP packet, and outputs a synchronization signal and packet data of the processing target which are included in a part of the checksum calculation to the checksum calculating circuit 112.

In step S602, the checksum calculating circuit 112 receives the input packet data, performs the checksum calculation, and outputs the checksum calculation result to the header byte managing unit 114. In step S603, the header byte managing unit 114 stores the input calculation result in the calculation result storage unit 121.

Meanwhile, in step S604, the header byte extracting unit 113 identifies a format of the IP packet, extracts part of a header byte, and outputs the extracted header byte to the header byte managing unit 114.

Then, in step S605, the header byte managing unit 114 receives the extracted header byte, and stores the extracted header byte in the header byte storage unit 122.

In step S606, the memory 116 temporarily stores the received IP packet. In step S607, the memory control circuit 117 reads the IP packet from the memory 116, and stores the read IP packet in the RAM 104.

In step S608, the header byte managing unit 114 determines whether or not the fragmentation has been executed, based on the header byte received in step S605.

When it is determined that the fragmentation has not been executed (NO in step S608), in step S609, the header byte managing unit 114 compares the checksum calculation result with the extracted checksum byte.

In step S610, the error determination interruption control unit 115 determines whether or not the packet is to be discarded based on the comparison result obtained in step S609. The determination result is output to the CPU 103 as the discarding execution signal. Thereafter, in step S611, the CPU 103 performs the controls including discarding on the packet stored in the RAM 104 according to the determination result included in the discarding execution signal.

Meanwhile, when it is determined that the fragmentation has been executed (YES in step S608), in step S612, the header byte managing unit 114 integrates the packet length transferred from the header byte extracting unit 113 with a previously received packet length, and stores an integrated packet length in the packet length integration information storage unit 123.

In step S613, the header byte managing unit 114 determines whether or not the integration information of the packet length matches with a final fragment offset. The final fragment offset refers to a fragment offset value of the last IP packet. When it is determined that the integration information of the packet length does not match with the final fragment offset (NO in step S613), it is recognized that none of packets identified by a corresponding ID were received, and the process is performed again from the beginning.

However, when it is determined that the integration information of the packet length matches with the final fragment offset (YES in step S613), in step S614, the header byte managing unit 114 compares the integrated checksum calculation result with the checksum byte, and outputs a comparison result and an ID corresponding to the comparison result to the error determination interruption control unit 115.

In step S615, the error determination interruption control unit 115 determines whether or not the packet identified by the ID is to be discarded based on the checksum comparison result, and outputs a discarding execution signal representing the determination result to the CPU 103 together with the corresponding ID.

In step S616, the CPU 103 performs the controls such that the packet identified by the ID is discarded or not discarded, based on the discarding execution signal.

Through the above described process procedure, the process such as discarding of the packet can be performed regardless of whether or not the fragmentation has been performed. In the information processing apparatus 100 according to the present embodiment, since the above described process is implemented by hardware, an operation is not sequentially performed like software. The above described process procedure is an example to help understand the present embodiment.

That is, in the information processing apparatus 100 according to the present embodiment, the checksum calculation and the discarding determination are performed at the Ethernet controller 102 side as the checksum calculation function on the TCP/UDP packet; and the discarding process is entrusted to software operating on the CPU 103. As a result, it is not necessary to save all packets at the Ethernet controller 102 side, and the capacity of the memory 116 or the like can be reduced by the saved part of the header byte.

In addition, in the information processing apparatus 100 according to the present embodiment, interim data is saved at the software side in the case of discarding; and a discarding instruction is given from the Ethernet controller 102 side when a packet is determined as a packet to be discarded. Thus, it is not necessary to save all packets that are to be discarded, and the capacity of the RAM 104 can be reduced.

As described above, since it is assumed that the process of determining whether or not the packet is to be discarded is performed by the Ethernet controller 102 which is of hardware, the processing time is reduced, and the processing load is reduced, compared to the process by software.

Modification

The above embodiment has been described in connection with the example in which the Ethernet controller 102 is mounted in the information processing apparatus. However, the embodiment is not limited to the example in which the Ethernet controller 102 is mounted in the information processing apparatus. As a modification, the Ethernet controller 102 may be mounted in an image processing apparatus or an image forming apparatus which is connectable to a network. When the Ethernet controller 102 is mounted in the image processing apparatus or the image forming apparatus, if image data is transmitted using the TCP/UDP protocol, the image data included in the TCP/UDP packet is transmitted. In this case, the image data may be transmitted in the form of fragmented packets. In this case, by performing the same control as in the above described embodiment, the capacity of a memory mounted in the Ethernet controller 102 of the image processing apparatus or the image forming apparatus can be reduced, and the processing load of a control unit (for example, CPU), provided separately from the Ethernet controller 102, can be reduced.

In the modification, the embodiment is considered to be applied to a multi-function peripheral (MFP) including at least two of a copy function, a printer function, a scanner function, and a facsimile function together with a network communication function as the image processing apparatus or the image forming apparatus, however, the embodiment can be applied to any image processing apparatus or image forming apparatus including a copying machine, a printer, a scanner device, and a facsimile device.

According to the embodiment, there is an effect capable of reducing the storage area for temporarily storing a packet and reducing the calculation processing time.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An information processing apparatus, comprising:
   a receiving unit that receives a fragment packet representing a packet that has been subjected to a fragmentation process;
   an extracting unit that extracts checksum information of which packet has not been subjected to the fragmentation process from any one of a plurality of received fragment packets, and causes the checksum information to be stored in a checksum storage unit;

a calculating unit that performs a checksum calculation on each of the plurality of received fragment packets, integrates a calculation result of each fragment packet, and causes an integrated calculation result to be stored in a calculation result storage unit; and a determining unit that determines whether or not there is an error in a packet obtained as a result of combining the plurality of fragment packets, based on the integrated calculation result stored in the calculation result storage unit and the checksum information stored in the checksum storage unit.

2. The information processing apparatus according to claim 1, wherein the extracting unit causes the extracted checksum information to be stored in the checksum storage unit for each piece of identification information identifying a packet, the calculating unit performs an integration of the calculation result for each identification information identifying a packet, and causes the integrated calculation result to be stored in the calculation result storage unit, and the determining unit determines whether or not there is an error in each packet identified by the identification information, based on information stored in the checksum storage unit and the calculation result storage unit.

3. The information processing apparatus according to claim 1, wherein the extracting unit, the calculating unit, and the determining unit are implemented by hardware.

4. The information processing apparatus according to claim 1, wherein with regard to packets obtained by fragmenting a TCP/UDP packet, the receiving unit receives a fragment packet to which an IP header is allocated, and the extracting unit causes checksum information included in a TCP/UDP header among header information included in the received fragment packet to be stored in the checksum storage unit.

5. The information processing apparatus according to claim 4, further comprising:

a storage unit that stores a plurality of fragment packets; and a control unit that performs control of eliminating the fragment packet included in the packet, determined to have an error by the determining unit, from the storage unit.

6. A communication control method operated in an information processing apparatus, comprising:

receiving a fragment packet representing a packet that has been subjected to a fragmentation process by a receiving unit;

extracting checksum information of which packet has not been subjected to the fragmentation process from any one of a plurality of received fragment packets, and causing the checksum information to be stored in a checksum storage unit by an extracting unit;

calculating a checksum on each of the plurality of received fragment packets, integrating a calculation result of each fragment packet, and causing an integrated calculation result to be stored in a calculation result storage unit by a calculating unit; and determining whether or not there is an error in a packet obtained as a result of combining the plurality of fragment packets, based on the integrated calculation result stored in the calculation result storage unit and the checksum information stored in the checksum storage unit by a determining unit.

7. A communication control system configured with a plurality of information processing apparatuses connectable to a network, the communication control system comprising:

a first information processing apparatus including a transmitting unit that transmits a fragment packet representing a packet that has been subjected to a fragmentation process; and a second information processing apparatus including:

a receiving unit that receives the fragment packet representing the packet that has been subjected to the fragmentation process;

an extracting unit that extracts checksum information of which packed has not been subjected to the fragmentation process from any one of a plurality of received fragment packets, and causes the checksum information to be stored in a checksum storage unit;

a calculating unit that performs a checksum calculation on each of the plurality of received fragment packets, integrates a calculation result of each fragment packet, and causes an integrated calculation result to be stored in a calculation result storage unit; and a determining unit that determines whether or not there is an error in a packet obtained as a result of combining the plurality of fragment packets, based on the integrated calculation result stored in the calculation result storage unit and the checksum information stored in the checksum storage unit.

8. The communication control system according to claim 7, wherein the extracting unit causes the extracted checksum information to be stored in the checksum storage unit for each piece of identification information identifying a packet, the calculating unit performs an integration of the calculation result for each identification information identifying a packet, and causes the integrated calculation result to be stored in the calculation result storage unit, and the determining unit determines whether or not there is an error in each packet identified by the identification information, based on information stored in the checksum storage unit and the calculation result storage unit.

9. The communication control system according to claim 7, wherein the extracting unit, the calculating unit, and the determining unit are implemented by hardware.

10. The communication control system according to claim 7, wherein with regard to packets obtained by fragmenting a TCP/UDP packet, the receiving unit receives a fragment packet to which an IP header is allocated, and the extracting unit causes checksum information included in a TCP/UDP header among header information included in the received fragment packet to be stored in the checksum storage unit.

11. The communication control system according to claim 10, further comprising:

a storage unit that stores a plurality of fragment packets; and a control unit that performs control of eliminating the fragment packet included in the packet, determined to have an error by the determining unit, from the storage unit.

12. The communication control system according to claim 7, wherein the receiving unit receives a plurality of fragmentation packets, and the fragmentation packets are obtained by dividing one packet.

13. The information processing apparatus according to claim 1, wherein the receiving unit receives a plurality of fragmentation packets, and the fragmentation packets are obtained by dividing one packet.

* * * * *